(12) United States Patent
Loeppert et al.

(10) Patent No.: US 6,987,859 B2
(45) Date of Patent: Jan. 17, 2006

(54) RAISED MICROSTRUCTURE OF SILICON BASED DEVICE

(75) Inventors: Peter V. Loeppert, Hoffman Estates, IL (US); Sung Bok Lee, Chicago, IL (US)

(73) Assignee: Knowles Electronics, LLC., Itasca, IL (US)

( * ) Notice: Subject to any disclaimer, the term of this patent is extended or adjusted under 35 U.S.C. 154(b) by 526 days.

(21) Appl. No.: 09/910,110

(22) Filed: Jul. 20, 2001

(65) Prior Publication Data

US 2003/0016839 A1    Jan. 23, 2003

(51) Int. Cl.
*H04R 25/00* (2006.01)
(52) U.S. Cl. ...................................... 381/174; 381/191
(58) Field of Classification Search ................ 381/113, 381/116, 173, 174, 190, 191, 369; 367/140, 367/170, 181; 29/25.41, 25.42
See application file for complete search history.

(56) References Cited

U.S. PATENT DOCUMENTS

| | | | |
|---|---|---|---|
| 4,628,740 A | 12/1986 | Ueda et al. | |
| 4,776,019 A | 10/1988 | Miyatake | |
| 4,825,335 A | 4/1989 | Wilner | 361/283 |
| 4,908,805 A | 3/1990 | Sprenkels et al. | 367/181 |
| 4,910,840 A | 3/1990 | Sprenkels | |
| 5,146,435 A | 9/1992 | Bernstein | 367/181 |
| 5,151,763 A | 9/1992 | Marek et al. | |
| 5,178,015 A | 1/1993 | Loeppert et al. | 73/718 |
| 5,357,807 A | 10/1994 | Guckel et al. | |
| 5,408,731 A | 4/1995 | Berggvist et al. | |
| 5,449,909 A | 9/1995 | Kaiser et al. | |
| 5,452,268 A | 9/1995 | Bernstein | 367/181 |
| 5,490,220 A | 2/1996 | Loeppert | 381/168 |
| 5,506,919 A | 4/1996 | Roberts | |
| 5,531,787 A | 7/1996 | Lesinski et al. | |
| 5,740,261 A | 4/1998 | Loeppert et al. | |
| 5,748,758 A | 5/1998 | Menasco, Jr. et al. | |
| 5,831,262 A | 11/1998 | Greywall et al. | |
| 5,870,482 A | 2/1999 | Loeppert et al. | 381/174 |
| 5,939,968 A | 8/1999 | Nguyen et al. | |
| 6,012,335 A | 1/2000 | Bashir et al. | 73/724 |
| 6,078,245 A | 6/2000 | Fritz et al. | |
| 6,108,184 A | 8/2000 | Minervini et al. | |
| 6,191,928 B1 | 2/2001 | Rector et al. | |
| 6,282,072 B1 | 8/2001 | Minervini et al. | |
| 6,535,460 B2 * | 3/2003 | Loeppert et al. | 367/181 |
| 2002/0067663 A1 | 6/2002 | Loeppert et al. | |

FOREIGN PATENT DOCUMENTS

WO    WO 02/15636    2/2002

* cited by examiner

*Primary Examiner*—Huyen Le
(74) *Attorney, Agent, or Firm*—Marshall, Gerstein & Borun LLP

(57) ABSTRACT

A raised microstructure for use in a silicon based device, such as a microphone, is disclosed. The raised microstructure comprises a generally planar film having a ribbed sidewall supporting the film.

23 Claims, 2 Drawing Sheets

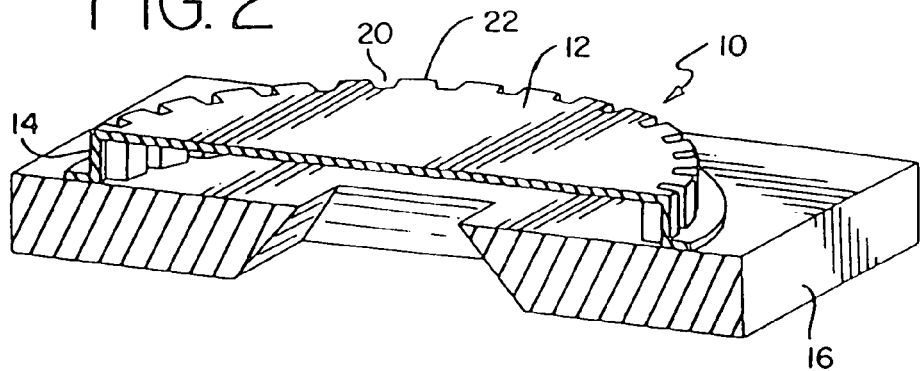
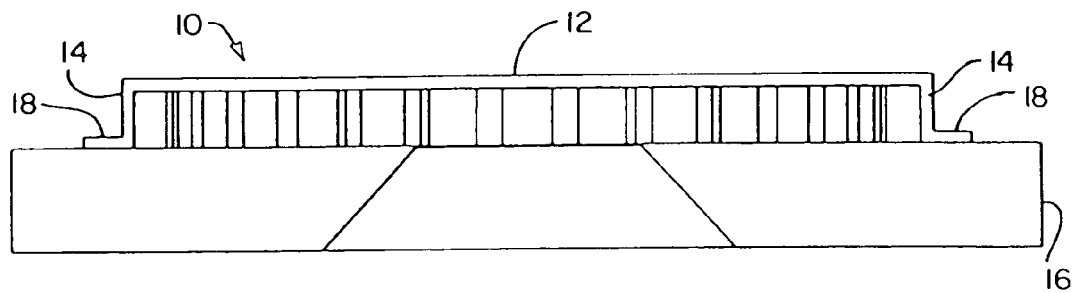
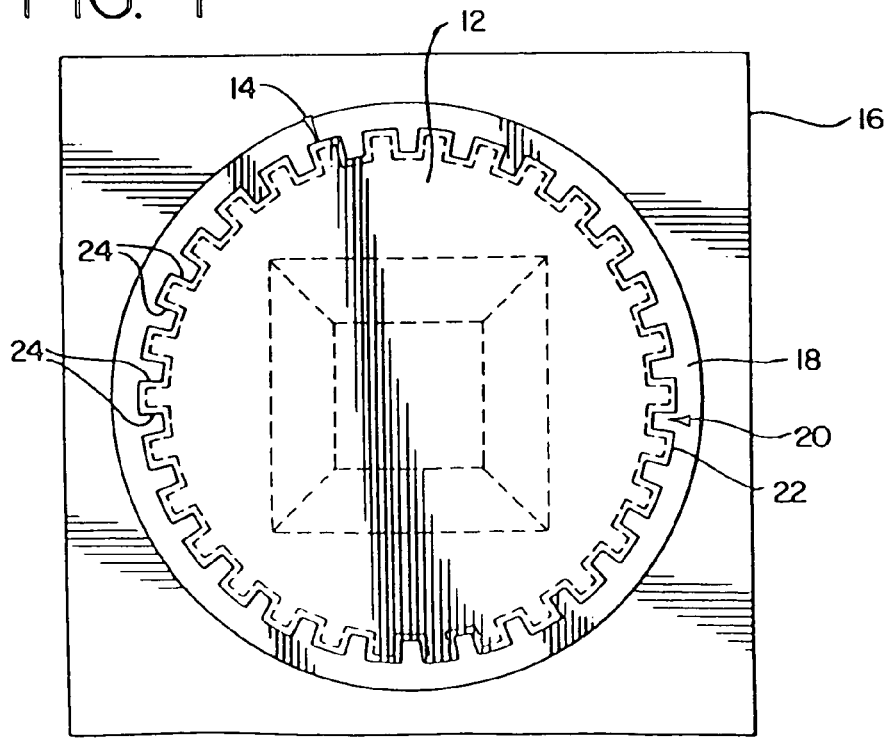

RAISED MICROSTRUCTURE OF SILICON BASED DEVICE

CROSS-REFERENCE TO RELATED APPLICATIONS

Not Applicable.

FEDERALLY SPONSORED RESEARCH OR DEVELOPMENT

Not Applicable.

TECHNICAL FIELD

The present invention relates to raised micro structures such as those found in pressure sensors, accelerometers and silicon based capacitive transducers and microphones. Specifically, the present invention is directed to improving the means of supporting a raised backplate of a silicon based capacitive transducer such as that found in a microphone.

BACKGROUND OF THE INVENTION

The use of silicon based capacitive transducers as microphones is well known in the art. Typically, such microphones consist of four elements: a fixed backplate; a highly compliant, moveable diaphragm (which together form the two plates of a variable air-gap capacitor); a voltage bias source and a buffer.

The two mechanical elements, the backplate and diaphragm, are typically formed on a single silicon substrate using a combination of surface and bulk micromachining well known in the art. One of these two elements is generally formed to be planar with the surface of the supporting silicon wafer. The other element, while itself generally planar, is supported several microns above the first element by posts or sidewalls, hence the term raised microstructure.

In general, the positioning of the two elements with respect to each other, affects the performance of the entire device. Intrinsic stresses in the thin films comprising the raised microstructure cause the structure to deflect out of the design position. In a microphone in particular, variations in the gap between the diaphragm and backplate affect the microphone sensitivity, noise, and over pressure response.

Many other factors also affect the manufacture, structure, composition and overall design of the microphone. Such problems are more fully discussed and addressed in U.S. Pat. No. 5,408,731 to Berggvist; U.S. Pat. No. 5,490,220 to Loeppert, and U.S. Pat. No. 5,870,482 to Loeppert.

In the specific example of the design of a microphone backplate as a raised microstructure, the goal is to create a stiff element at a precise position relative to the diaphragm. One method to achieve this is to form the backplate using a silicon nitride thin film deposited over a shaped silicon oxide sacrificial layer which serves to establish the desired separation. This sacrificial layer is later removed through well known etch processes, leaving the raised backplate. Intrinsic tensile stress in the silicon nitride backplate will cause it to deflect out of position. Compressive stress is always avoided as it causes the structure to buckle.

FIG. 1 depicts one such raised microstructure 10 of the prior art. After the oxide is removed leaving the raised microstructure 10, an intrinsic tension will be present within the plate 12. This tension T results from the manufacturing process as well as from the difference between the coefficient of expansion of the material of the raised microstructure 10 and the supporting wafer 16. As shown, the tension T is directed radially outwards. The tension T intrinsic in the plate 12 will result in a moment as shown by arrow M about the base 18 of sidewall 14. This moment M results in a tendency of the plate 12 to deflect towards the wafer 16 in the direction of arrow D. This deflection of plate 12 results in a negative effect on the sensitivity and performance of the microphone.

A number of undesirable means to negate the effects of this intrinsic tension within a thin-film raised microstructure are known in the prior art. Among them are that the composition of the thin film can be adjusted by making it silicon rich to reduce its intrinsic stress levels. However, this technique has its disadvantages. It results in making the thin film less etch resistant to HF acid, increasing the difficulty and expense of manufacture. An additional solution known in the prior art would be to increase the thickness of the sidewall supporting the raised backplate thereby increasing the sidewall's ability to resist the intrinsic tendency of the thin film to deflect. While this sounds acceptable from a geometry point of view, manufacture of a thick sidewall when the raised microstructure is made using thin film deposition is impractical.

It is an object of the present invention to overcome the disadvantages of the prior art with respect to the design of raised microstructures in silicon based devices by negating the undesirable effects of the intrinsic thin film tension inherent in said microstructure.

SUMMARY OF THE INVENTION

It is an object of the present invention to provide an improvement to raised microstructures for use in silicon based devices. In accord with one embodiment of the present invention, a raised microstructure for use in a silicon based device is provided comprising a generally planar thin-film and a sidewall supporting the film, wherein the sidewall is ribbed.

Other features and advantages of the invention will be apparent from the following specification taken in conjunction with the following drawings.

BRIEF DESCRIPTION OF THE DRAWINGS

The raised microstructure of the present invention will now be described with reference to the accompanying drawings, in which:

FIG. 2 is a cross sectional perspective view of a raised microstructure embodying the present invention;

FIG. 3 is a cross section of the raised microstructure of FIG. 2; and

FIG. 4 is a plan view of FIG. 2.

DETAILED DESCRIPTION OF THE INVENTION

Figure 1:
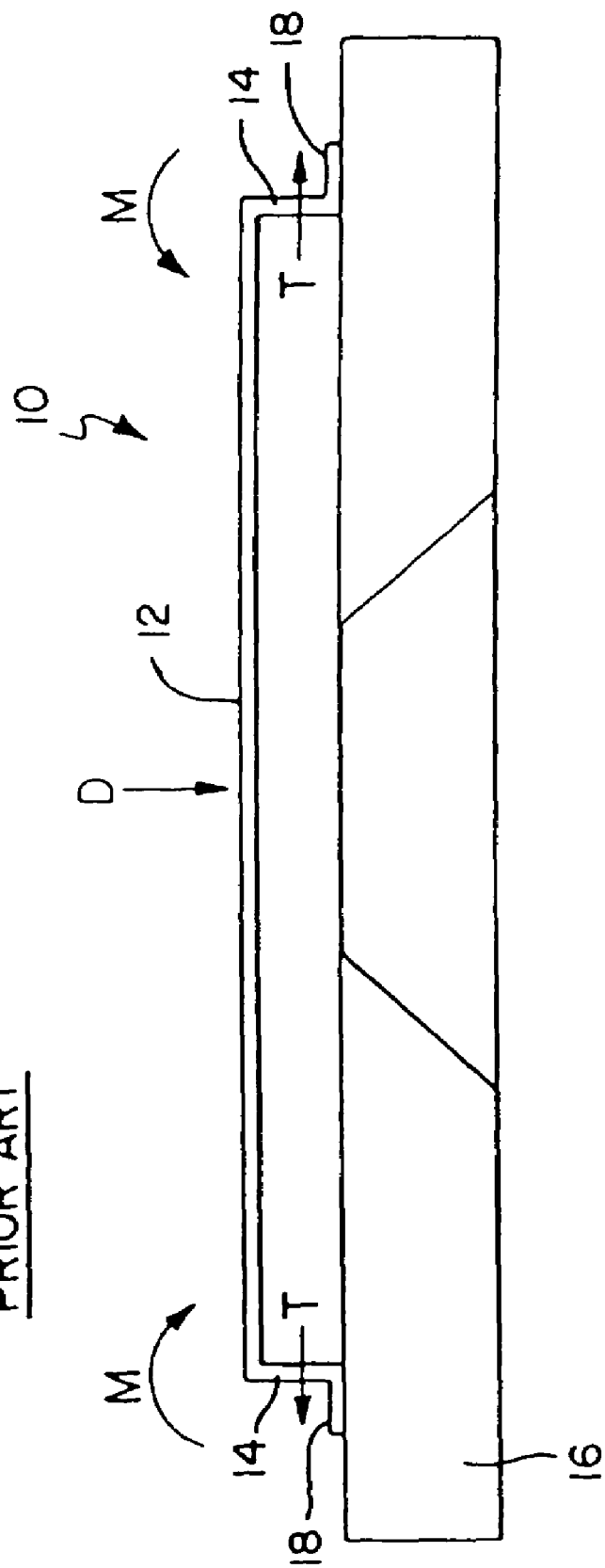
FIG. 1 is a cross sectional schematic of a raised microstructure known in the prior art.

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated.

An embodiment of the raised microstructure 10 of the present invention is shown in FIGS. 2 & 3. The raised microstructure 10 comprises a generally circular thin-film plate or backplate 12 supported by a sidewall 14.

The raised microstructure 10 is comprised of a thin film plate 12 of silicon nitride deposited on top of a sacrificial silicon oxide layer on a silicon wafer 16 using deposition and etching techniques readily and commonly known to those of ordinary skill in the relevant arts. The sacrificial silicon oxide layer has already been removed from the figure for clarity. The sidewall 14 of the raised microstructure 10 is attached at its base 18 to the silicon wafer 16 and attached at its opposite end to the plate 12. The sidewall 14 is generally perpendicular to plate 12, but it is noted other angles may be utilized between the sidewall 14 and the plate 12.

FIG. 4 shows a plan view of the assembly of FIG. 2 with a surface of the sidewall 14 of the present invention shown in phantom. It can be seen that the sidewall 14 of the present invention as shown in FIGS. 2–4 is ribbed, forming a plurality of periodic ridges 20 and grooves 22. In the preferred embodiment, the ridges 20 and grooves 22 are parallel and equally spaced, forming a corrugated structure. Furthermore, the preferred embodiment utilizes ridges 20 and grooves 22 of a squared cross section. The effect of corrugating the side wall in this manner is to create segments 24 of the sidewall 14 that are radial, as is the intrinsic tension T of the plate 12. By making portions of the sidewall 14 radial, as is the tension T, the sidewall 14 is stiffened. It has been found that the sidewall 14 of the prior art, which is tangential to plate 12, is easily bent as compared to the radial segments 24 of the present invention.

Other geometries than that shown in FIGS. 2–4 of the corrugations or ridges 20 and grooves 22 can be imagined and used effectively to increase the sidewall's 14 ability to resist moment M and the geometry depicted in the FIGS. 2–4 is not intended to limit the scope of the present invention.

For example, a generally annular geometry, generally triangular geometry or any combination or variation of these geometries or others could be utilized for the ridges 22 and grooves 24.

In the preferred embodiment, the corrugations are radial and hence the sidewalls 14 are parallel to the tension in the backplate 12. Furthermore, the sacrificial material is etched in such a way that the sidewalls 14 are sloped with respect to the substrate to allow good step coverage as the thin film backplate 12 is deposited.

While the specific embodiments and various details thereof have been illustrated and described, numerous modifications come to mind without significantly departing from the spirit of the invention and the scope of protection is only limited by the following claims.

What is claimed is:

1. A raised microstructure for use in a silicon based device, the raised microstructure comprising:
   a generally planar thin-film plate having a periphery;
   a ribbed sidewall, the ribbed sidewall including a plurality of ridges and grooves, the ridges and grooves extending about substantially the entire periphery and further being arranged substantially perpendicular to an edge of the thin-film plate defined by the periphery, the ribbed sidewall arranged to support the generally planar thin-film plate along the periphery;
   wherein the plurality of ridges and grooves of the ribbed sidewall form at least one rib, and wherein the at least one rib stiffens the ribbed sidewall.

2. The raised microstructure of claim 1 wherein the ridges and grooves of the ribbed sidewall are parallel and equally spaced to form a corrugated sidewall.

3. The raised microstructure of claim 1 wherein the rib has a generally arcuate cross section.

4. The raised microstructure of claim 1 wherein the rib has a generally triangular cross section.

5. The raised microstructure of claim 1 wherein the rib has a generally rectangular cross section.

6. The raised microstructure of claim 1 wherein the thin-film comprises one plate of a silicon based capacitive transducer.

7. The raised microstructure of claim 1 wherein the thin-film comprises a rigid backplate of a silicon based microphone.

8. The raised microstructure of claim 1 wherein the sidewall substantially completely encloses the area beneath the thin-film.

9. A silicon based electret microphone having a backplate comprising:
   a generally planar thin-film plate having a periphery defining an edge of the thin-film plate;
   a sidewall having a plurality of ridges and grooves, the sidewall arranged to support the thin-film plate, the ridges and grooves extending about substantially the entire periphery and further being arranged substantially perpendicular to the edge;
   wherein the plurality of ridges and grooves of the sidewall cooperate to form ribs about the periphery.

10. The microphone of claim 9 wherein the ridges and grooves of the ribbed sidewall are parallel and equally spaced to form a corrugated sidewall.

11. The microphone of claim 9 wherein the rib has a generally arcuate cross section.

12. The microphone of claim 9 wherein the rib has a generally triangular cross section.

13. The microphone of claim 9 wherein the rib has a generally rectangular cross section.

14. The microphone of claim 9 wherein the sidewall includes a plurality of ribs.

15. The microphone of claim 14, wherein the ribs are equally spaced about the sidewall.

16. The microphone of claim 9 wherein the sidewall substantially completely encloses the area beneath the thin-film.

17. A raised microstructure for use in a silicon based device, the raised microstructure comprising:
   generally planar element with a first thickness and a periphery defining an edge;
   a sidewall including a plurality of ridges and grooves, the sidewall having a second thickness;
   said sidewall being substantially continuous about the entire periphery and supporting said planar element at said periphery above a substrate at a distance;
   wherein said plurality of ridges and grooves of the sidewall cooperate to form a plurality of ribs.

18. The raised microstructure of claim 17 wherein said first thickness is small compared to the lateral extent of the said planar element.

19. The raised microstructure of claim 17 wherein said second thickness is approximately equal to the said first thickness.

20. The raised microstructure of claim 17 wherein said distance is large compared to said second thickness.

21. The raised microstructure of claim 17 wherein the ribs follow a periodic path of the periphery, inwards and outwards with respect to the centroid of the planar element.

22. The raised microstructure of claim 21 wherein the path is arcuate.

23. The raised microstructure of claim 17 wherein the sidewall substantially completely encloses the area beneath the element.

* * * * *